US012710458B2

(12) United States Patent
Swaans et al.

(10) Patent No.: US 12,710,458 B2
(45) Date of Patent: Aug. 18, 2026

(54) METHOD FOR POWER CALIBRATION

(71) Applicant: ELECTDIS AB, Malmö (SE)

(72) Inventors: Laurens Swaans, Malmö (SE); Max Andersson, Malmö (SE); Joakin Wallman, Malmö (SE)

(73) Assignee: ELECTDIS AB, Malmö (SE)

( * ) Notice: Subject to any disclaimer, the term of this patent is extended or adjusted under 35 U.S.C. 154(b) by 146 days.

(21) Appl. No.: 18/837,135

(22) PCT Filed: Feb. 13, 2023

(86) PCT No.: PCT/SE2023/050117
§ 371 (c)(1),
(2) Date: Aug. 8, 2024

(87) PCT Pub. No.: WO2023/153995
PCT Pub. Date: Aug. 17, 2023

(65) Prior Publication Data

US 2025/0138066 A1 May 1, 2025

(30) Foreign Application Priority Data

Feb. 11, 2022 (SE) .................................... 2250139-9

(51) Int. Cl.
*G01R 21/06* (2006.01)
*G01R 19/02* (2006.01)
(Continued)

(52) U.S. Cl.
CPC ............. *G01R 21/06* (2013.01); *G01R 19/02* (2013.01); *G01R 35/005* (2013.01); *H02J 50/80* (2016.02)

(58) Field of Classification Search
CPC ................................ G01R 21/06; G01R 19/02
See application file for complete search history.

(56) References Cited

U.S. PATENT DOCUMENTS 6,815,942 B2 11/2004 Randall et al.
10,031,165 B2 7/2018 McFarthing
(Continued)

FOREIGN PATENT DOCUMENTS

EP 1875553 A2 1/2008
EP 3035490 A1 6/2016
EP 3800765 A1 4/2021

OTHER PUBLICATIONS

PCT International Preliminary Report on Patentability for PCT/SE2023/050117, dated May 3, 2024.
(Continued)

*Primary Examiner* — Walter L Lindsay, Jr.
*Assistant Examiner* — Milton Gonzalez
(74) *Attorney, Agent, or Firm* — Honigman LLP

(57) ABSTRACT

To calibrate a power measuring function of a wireless power device, an alternating electric signal is fed through a wireless power transmitter coil to drive the wireless power transmitter coil at an operating point. Voltage measurements and current measurements are performed upon the alternating electric signal or upon a current signal resulting therefrom. A power value is calculated from a resulting series of voltage values and series of current values. If, upon assessment, the calculated power value does not meet a specification, a compensatory change is introduced in the series of voltage values or current values to account for a phase shift between the voltage measurements and current measurements at the operating point. The compensatory change is stored and enables the power measuring function to produce wireless power measurement results at the operating point which are consistent with the specification.

15 Claims, 9 Drawing Sheets

1100
Calibrating a power measuring function of a wireless power device

1110
Feeding an alternating electric signal through a wireless power transmitter coil to drive the wireless power transmitter coil at an operating point 1120
Performing voltage measurements and current measurements upon said alternating electric signal or upon an electric signal resulting therefrom in the wireless power device 1130
Producing a series of voltage values and a series of current values from the voltage measurements and current measurements 1140
Calculating a power value from the produced series of voltage values and series of current values 1150
Does calculated power value meet specification?

Yes

No

1160
Introducing a compensatory change in either of the produced series of voltage values and series of current values to account for a phase shift between the voltage measurements and current measurements at said operating point 1170
Storing the compensatory change for the wireless power device, thereby enabling the power measuring function thereof to produce wireless power measurement results at said operating point which are consistent with said specification 1180
Repeat for a plurality of operating points

(51) Int. Cl.
*G01R 35/00* (2006.01)
*H02J 50/80* (2016.01)

(56) References Cited

U.S. PATENT DOCUMENTS

| | | | | |
|---|---|---|---|---|
| 10,530,196 | B2 * | 1/2020 | Oettinger ................ | H02J 50/80 |
| 2015/0142348 | A1 | 5/2015 | Huang et al. | |
| 2019/0011523 | A1 | 1/2019 | Avestruz et al. | |
| 2021/0261006 | A1 | 8/2021 | Böhler et al. | |

OTHER PUBLICATIONS

Extended European Seacrh Report for EP 23753288.2, dated Jan. 21, 2026.

* cited by examiner

METHOD FOR POWER CALIBRATION

CROSS-REFERENCE TO RELATED APPLICATIONS

This application is the U.S. National Stage application under 35 U.S.C. 371 of International Application No. PCT/SE2023/050117, filed Feb. 13, 2023, which claims priority to Swedish Patent Application No. 2250139-9 filed on Feb. 11, 2022. The entire contents of both applications are incorporated herein by reference in their entirety.

TECHNICAL FIELD

The present invention generally relates to the field of wireless power transfer, and more specifically to testing of wireless power transfer equipment. Even more specifically, the present invention relates to a method of calibrating a power measuring function of a wireless power device.

BACKGROUND

It is common knowledge that power measurements at high operating frequencies are difficult to perform. This is caused by two factors. First, the fundamental difference between a voltage measurement and a current measurement introduces a phase shift between these two quantities; this phase shift changes over frequency. Second, the harmonic content of signals contributes significantly to the observed power values and cannot be ignored or predicted.

As power is the product of voltage and current, both measurements are needed for a user to obtain information on the power. The power of a periodical signal can be written as follows:

$$P = avg(p(t)) = avg(v(t) \cdot i(t)),$$

where the averaging must happen over a period significantly larger than T=1/f, the fundamental frequency of the signal.

For purely sinusoidal signals the equation can be simplified into:

$$P = \mathrm{V} \cdot I \cdot \cos(\phi),$$

where V and I are the RMS values of the voltage and current, and φ is the phase shift between the voltage and current.

Accounting for the harmonic content could be done by using a Fourier transformation of the input signal (splitting the periodic time-series up into a sum of all frequencies) and determining the phase shift of each frequency:

$$P_{avg} = \sum_{i=0}^{N-1} \mathrm{V}_i \cdot I_i \cdot \cos(\phi_i).$$

where N is the number of bins in the FFT.

A relevant area where power measurements are very popular (due to reasons of safety as well as energy efficiency) is wireless power transfer. Wireless power transfer is growing increasingly popular, for instance for wireless battery charging of mobile devices like mobile terminals, tablet computers, laptop computers, cameras, audio players, electric toothbrushes, wireless headsets and smart watches, as well as various other consumer products and appliances.

The Wireless Power Consortium has developed a wireless power transfer standard known as Qi. Other known wireless power transfer initiatives include Alliance for Wireless Power, and Power Matters Alliance. The wireless power transfer standard known as Qi by the Wireless Power Consortium will be referred to, without limitation, throughout this document as the presently preferred wireless power transfer manner applicable to the present invention. However, the invention may generally be applied also to other wireless power transfer standards or initiatives, including but not limited to the ones mentioned above.

Operation of devices that comply with Qi relies on magnetic induction between planar coils. Two kinds of devices are involved, namely devices that provide wireless power (referred to as base stations or power transmitter products), i.e. wireless power transmitter devices, and devices that consume wireless power (referred to as mobile devices or power receiver products), i.e. wireless power receiver devices. Power transfer takes place from a base station to a mobile device. For this purpose, a base station contains a subsystem (a power transmitter) that comprises a primary coil, whereas a mobile device contains a subsystem (a power receiver) that comprises a secondary coil. In operation, the primary coil and the secondary coil will constitute the two halves of a coreless resonant transformer. Typically, a base station has a flat surface, on top of which a user can place one or more mobile devices so as to enjoy wireless battery charging or operational power supply for the mobile device(s) placed on the base station.

This can be seen in FIG. 1 which illustrates a wireless power transmitter device 120 for wireless power transfer to a mobile device 110 (or power receiver product), i.e., a wireless power receiver device. The mobile device 110 may, for instance, be a mobile terminal (e.g. smart phone) 110*a*, tablet computer 110*b* (e.g. surf pad), laptop computer 110*c*, smart watch 110*d*, camera, audio player, rechargeable toothbrush, wireless headset, or another kind of consumer product or appliance.

Since the wireless power transfer is exemplified in this document as being compliant with the Qi standard by the Wireless Power Consortium, the wireless power transmitter device 120 is a base station or power transmitter product in the Qi terminology. However, the invention is—as mentioned above—generally applicable also to other wireless power transfer standards or approaches.

The wireless power transmitter device 120 comprises a wireless power transmitter 122 having a wireless power transmitter coil 124 and being controlled by a power controller 126. Correspondingly, the mobile device 110 comprises a wireless power receiver 112 having a wireless power receiver coil 114. Each coil 114, 124 is an inductor with a resistive element. In operation, the wireless power transmitter device 120 will transfer power wirelessly to the mobile device 110 by way of magnetic induction 118 via the wireless power transmitter coil 124 and wireless power receiver coil 114.

The power received by the wireless power receiver coil 114 will drive a load 116 in the mobile device 110. Typically, the load 116 may be a rechargeable battery, such as a lithium ion battery; hence, the wireless power transmitter device 120 will act as a wireless power charger for the mobile device 110. In another scenario, the load 116 may be electronic circuitry in the mobile device, wherein the wireless power transmitter device 120 will act as a wireless power supply for the mobile device 110.

Throughout this document, wireless charging will be used as an example of wireless power transfer, i.e. a species among a genus, without limitation.

In wireless power transfer applications there is a need for knowing the amount of power that is leaving a power transmitting device (in the form of electromagnetic radiation), or the amount of power (in the form of electromagnetic radiation) that is being absorbed by a power receiving device. Accurate power measurements are essential in the field of wireless power transfer. Apart from safety aspects related to foreign object detection, there is also a need for accurate power measurements when it comes to measuring and determining the efficiency of a wireless power system. With programs such as EnergyStar, a reliable rating of device performance becomes a competitive aspect for products offering wireless power transfer. These needs may exist in various interest groups, such as developers, manufacturers or suppliers of mobile devices; developers, manufacturers or suppliers of wireless power transmitter devices; test or compliance entities in the field of wireless power transfer; and test or compliance entities in the field of consumer product safety.

Accurate power measurements in wireless power transfer devices pose a challenge in several aspects as compared to commonly available AC power measurement equipment in general. The signal frequency is much higher, in the order of 100 kHz as compared 100 Hz, i.e. a thousand times higher. Furthermore, the harmonic distortion is much higher, because of square waves versus sine waves. Moreover, the nature of a wireless power transfer system implies low ratio of real power versus apparent power (or, alternatively phrased, that there is a substantial amount of reactive power, because what is charged is far from an ideal resistive load).

A common problem with power measurements is that the circuit used to measure the voltage has different characteristics from the circuit used to measure the current. The so-called transfer function between the actual voltage and measured value will show a different dynamic behavior as the transfer function between the actual current and that measured value. So, by the time the values are multiplied there is already an (unequal) phase-shift incurred in the signals that creates an error in the power measurement.

More harmonic content makes this problem more complex (square wave versus sinewave) and so does having complex loads (inductive or capacitive loads versus resistive loads). The harmonic content obviously because the phase shift incurred by the signals varies over frequency. With more harmonic content there are more frequencies to be taken into consideration, each frequency with its own phase shift.

The impact of complex loads becomes clearly visible when considering a small phase error at a resistive load (where $\phi=0°$) with a highly inductive load (where $\phi=85°$):

$$V \cdot I \cdot \cos(0°) - V \cdot I \cdot \cos(1°) = V \cdot I \cdot 0.000152$$

$$V \cdot I \cdot \cos(85°) - V \cdot I \cdot \cos(86°) = V \cdot I \cdot 0.0174$$

As can be seen above, at 85 degree's phase shift, a 1-degree variation has more than 100 times bigger impact on the power value. This is visualized in FIG. 2, containing a graph 210 representing half a period of the function y=cos (x). At degrees x close to 0, the graph 210 has a flat slope as seen at 220, whereas at degrees x close to 90, the slope of the graph 210 is quite steep as seen at 230.

Recalling that wireless power transfer applications require the measurement of power flowing into or out of an inductor (the power coil), this highlights some complications:

- The signal is usually quite sensitive to phase errors (the closer to 90 degrees, the higher the sensitivity to errors).
- The losses of the power coil itself need to be compensated:
  - The power dissipated in the coil itself needs to be subtracted from the measurements on a power transmitting coil.
  - The power dissipated in the coil needs to be added to the measurements on a power receiver coil.
  - The loss in the power coil is a complex function that requires (apart from the current flowing through the coil) knowledge of the signal frequency, harmonic content, impedance of the coil (as a function of frequency) and temperature.
- When the voltage has a square waveform (typically the case when an H-bridge inverter is used), the current will be a triangle waveform. This also means that the harmonic content in voltage is different from that in current.

The present inventors have realized that there is a need for improvements in these regards.

SUMMARY

Accordingly, it is an object of the invention to offer improvements in power measurements for wireless power transfer equipment and to eliminate or mitigate one or more of the problems identified above.

Generally speaking, the invention is a calibration method for power measurement in wireless power transfer applications (end-user products, test tools, etc.). This method can be used to compensate for the (often unknown) phase shift caused by the independent measurement circuits in a power measurement application.

In consideration of the above, an inventive aspect is a method of calibrating a power measuring function of a wireless power device. The method comprises feeding an alternating electric signal through a wireless power transmitter coil to drive the wireless power transmitter coil at an operating point. The method further comprises performing voltage measurements and current measurements upon said alternating electric signal or upon a current signal resulting therefrom in the wireless power device, and producing a series of voltage values and a series of current values from the voltage measurements and current measurements. The method moreover comprises calculating a power value from the produced series of voltage values and series of current values, and assessing whether the calculated power value meets a specification. If not, the method introduces a compensatory change in either of the produced series of voltage values and series of current values to account for a phase shift between the voltage measurements and current measurements at said operating point, and stores the compensatory change for the wireless power device. This enables the power measuring function of the wireless power device to produce wireless power measurement results at said operating point which are consistent with said specification, by using the stored compensatory change.

Other aspects, objectives, features and advantages of the disclosed embodiments will appear from the following detailed disclosure, from the attached dependent claims as well as from the drawings. Generally, all terms used in the claims are to be interpreted according to their ordinary meaning in the technical field, unless explicitly defined otherwise herein.

All references to "a/an/the [element, device, component, means, step, etc.]" are to be interpreted openly as referring to at least one instance of the element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

Objects, features and advantages of embodiments of the invention will appear from the following detailed description, reference being made to the accompanying drawings.

DETAILED DESCRIPTION

Figure 1:
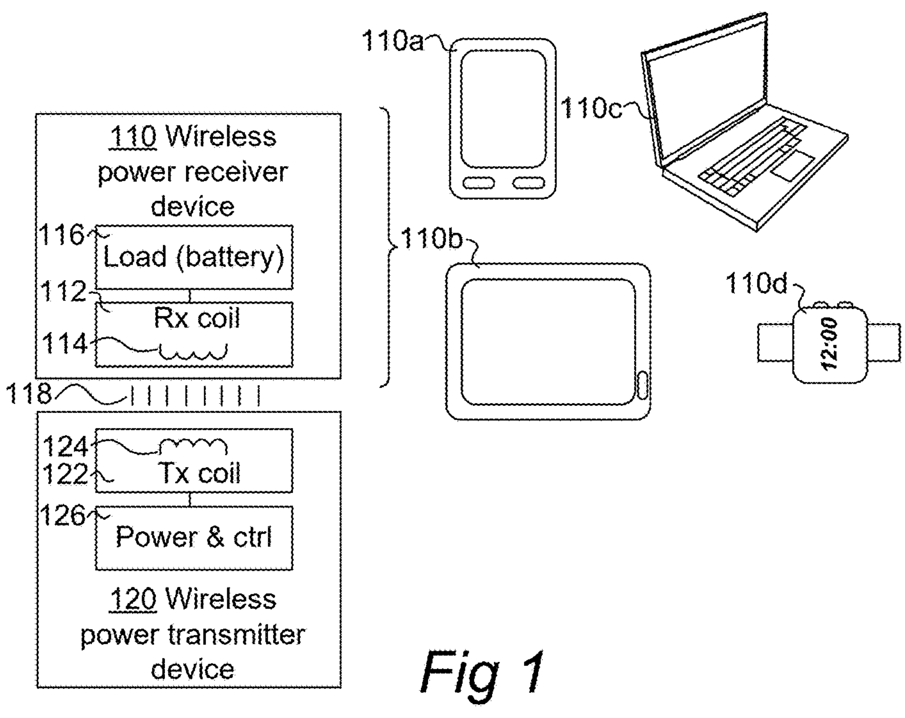
FIG. 1 is a schematic block diagram of a wireless power transmitter device for wireless power transfer to a wireless power receiver device.
Figure 2:
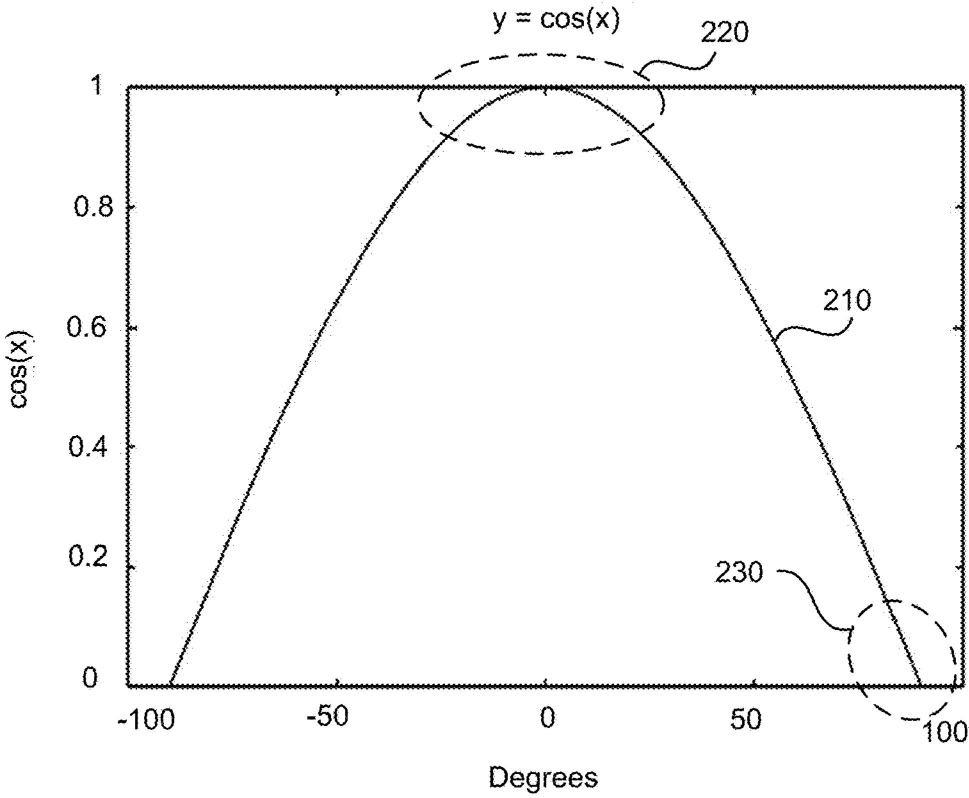
FIG. 2 is a schematic illustration of the cosine function.

Embodiments of the invention will now be described with reference to the accompanying drawings. The invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular embodiments illustrated in the accompanying drawings is not intended to be limiting of the invention. In the drawings, like numbers refer to like elements. Elements illustrated as hatched boxes are generally to be seen as optional in the particular drawing in which they appear.

Introductory Remarks and Framework for the Invention

As mentioned above, the invention pertains to calibration for power measurement in wireless power transfer applications (end-user products, test tools, etc.). The calibration can be used to compensate for the phase shift caused by the independent measurement circuits in a power measurement application. The method assumes that an accurate loss estimation of the power coil is available.

In the forthcoming description of the invention and its embodiments, certain activities (or functionalities) will be referred to. For instance, calibration of $V_{RMS}$ and $I_{RMS}$ includes any procedure for generic measurement equipment that reduces the error of voltage and current measurements. Moreover, compensate for phase shift can, for example, be to add an artificial delay to the time series of current measurement values, such that

- the RMS value remains unchanged,
- the calculated transmitted/received power value is closer to the desired value.

Furthermore, change operating point can be any combination of changes in operating frequency, load resistance, coil current, coil voltage, harmonic content, temperature, etc.

Figure 3:
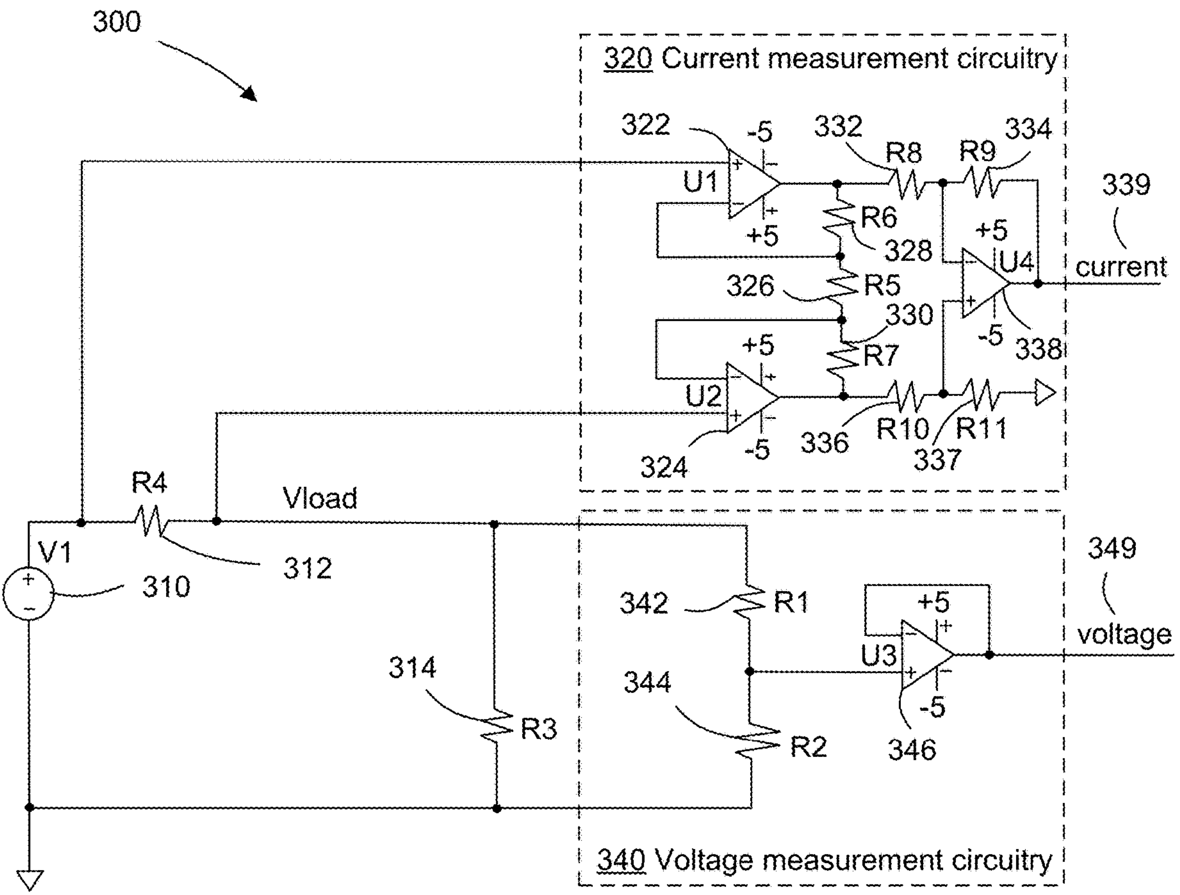
FIG. 3 is a schematic circuit diagram illustrating a measurement arrangement that can be used for measuring current and voltage with the objective to calculate power.

Starting with FIG. 3, this drawing shows an example of a typical measurement arrangement 300 that can be used for measuring current and voltage with the objective to calculate the power. The topology of the measurement arrangement 300 is for all practical matters conventional as such. Hence, the skilled person will readily notice that the measurement arrangement 300 comprises current measurement circuitry 320 and voltage measurement circuitry 340, both fed from a voltage source 310 via elements 312 and 314. The current measurement circuitry 320 comprises circuit elements 322-338 and outputs a current signal 339. The voltage measurement circuitry 340 comprises circuit elements 342-346 and outputs a voltage signal 349. The skilled reader will readily realize that other topologies are possible for implementing electronic circuitry for measuring current and voltage for the purpose of calculating electric power.

The current signal 339 and voltage signal 349 will be sampled by an Analog-to-Digital Converter (ADC) which turns the actual (analog) voltage into a number such that it can be digitally processed.

Figure 4:
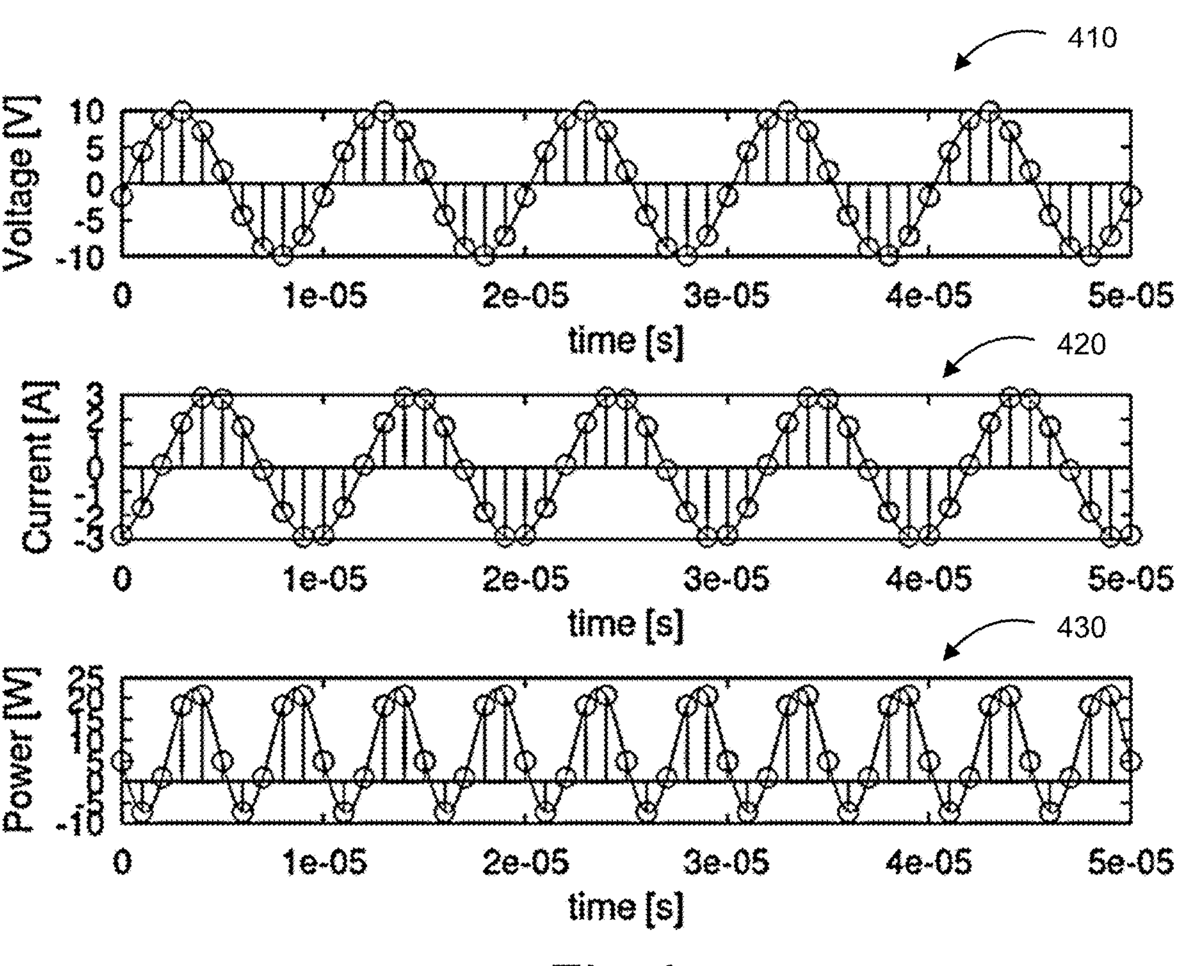
FIG. 4 illustrates current, voltage and power signals in analog and time-discrete forms.

The ADC takes measurement samples at a sampling frequency $f_{sample}$, meaning that two consecutive samples are distanced by $T_{sample}=1/f_{sample}$ seconds in time. This turns the continuous time signal v(t) into a discrete time series v(n), where n is the instantaneous value obtained at time t. The time series then becomes a representation of the digital signal with values every $T_{sample}$ seconds. FIG. 4 shows an example where the continuous line shows the continuous-time signals v(t), i(t) and p(t) and the stem plots show the discrete time series of those signals v(n), i(n), and p(n). This example uses a 100 kHz signal and a 1 MHz sampling frequency. The phase shift between the voltage signal 410 and current signal 420 is 60 degrees, which can be seen when taking the average value of the power signal 430 and comparing this to the function:

$$V \cdot I \cdot \cos(\phi) = \frac{10}{\sqrt{2}} \cdot \frac{3}{\sqrt{2}} \cdot \cos(60) = 15 \cdot 0.5 = 7.5 \text{ W}.$$

The average value of the continuous time signal is 7.4995 W when averaging over 500 μs. The average value of the discrete time-series signal is 7.4948 W when using the same averaging window. This could be achieved by simply taking the mean value of the time-series with a 500 μs length:

$$\frac{1}{501}\cdot\sum_{i=1}^{i=501}(v(n)\cdot i(n)).$$

Pursuant to the invention, either one of the time series is adjusted to compensate for the phase shift experienced by the signals in a particular measurement device.

For example, the time series of the current (cf. stem plots at 420 in FIG. 4) could be modified with an artificial phase shift such that the original time series as defined by:

$$i(n)=i(t)\ \text{for every}\ t=k\cdot T_{sample}$$

is converted into:

$$i(n)=i(t+\varepsilon)\ \text{for every}\ t=k\cdot Tsample$$

The value for i(t+ε) can be obtained by linear interpolation between samples $i(t_0)$ and $i(t_1)$.

By adjusting the value ε the calculated power value can be tuned without impacting the result for RMS current.

The General Inventive Concept

Figure 10:
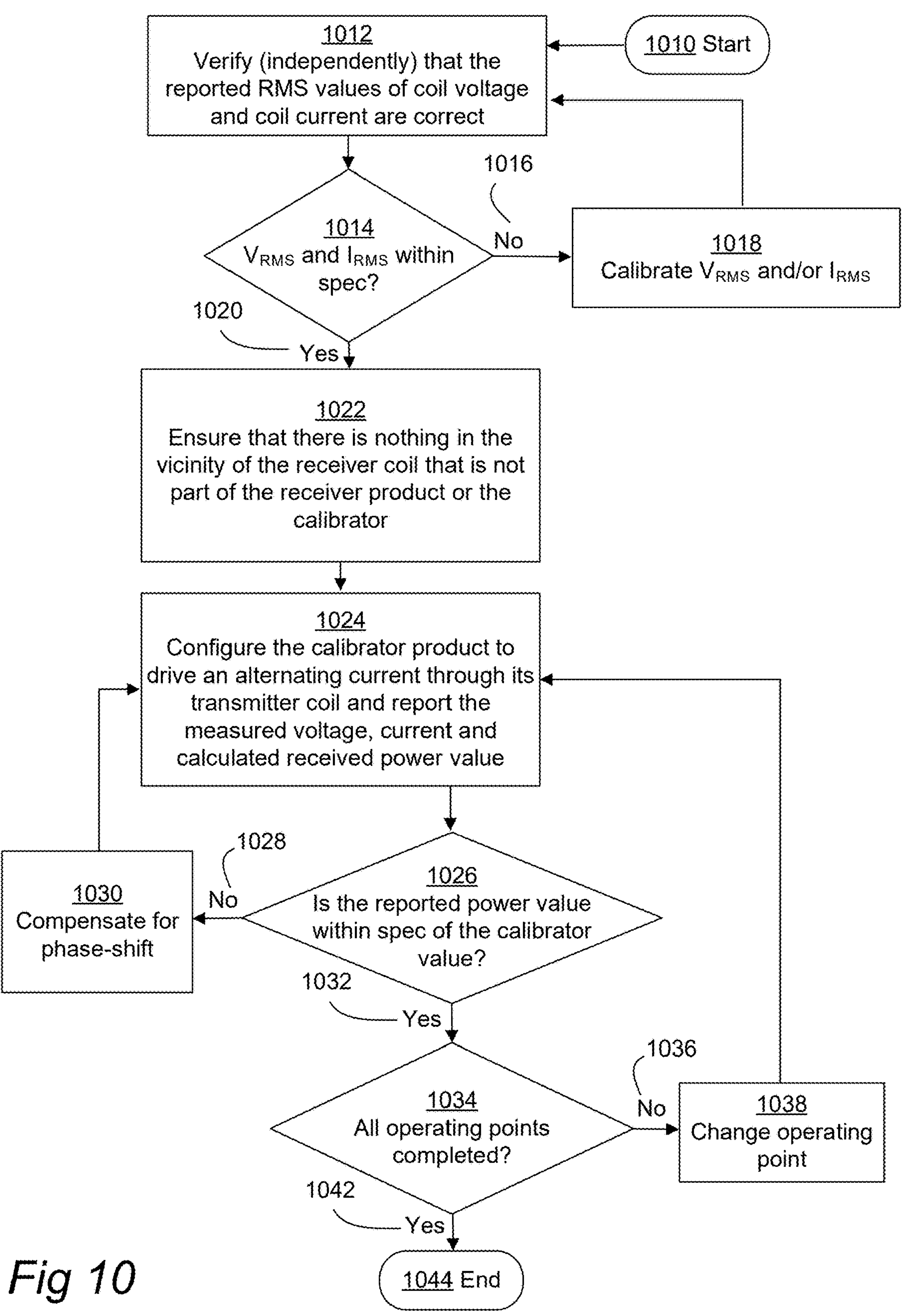
FIG. 10 is a flowchart diagram of a third embodiment of a power calibration method performable for the wireless power device in FIG. 9.
Figure 11:
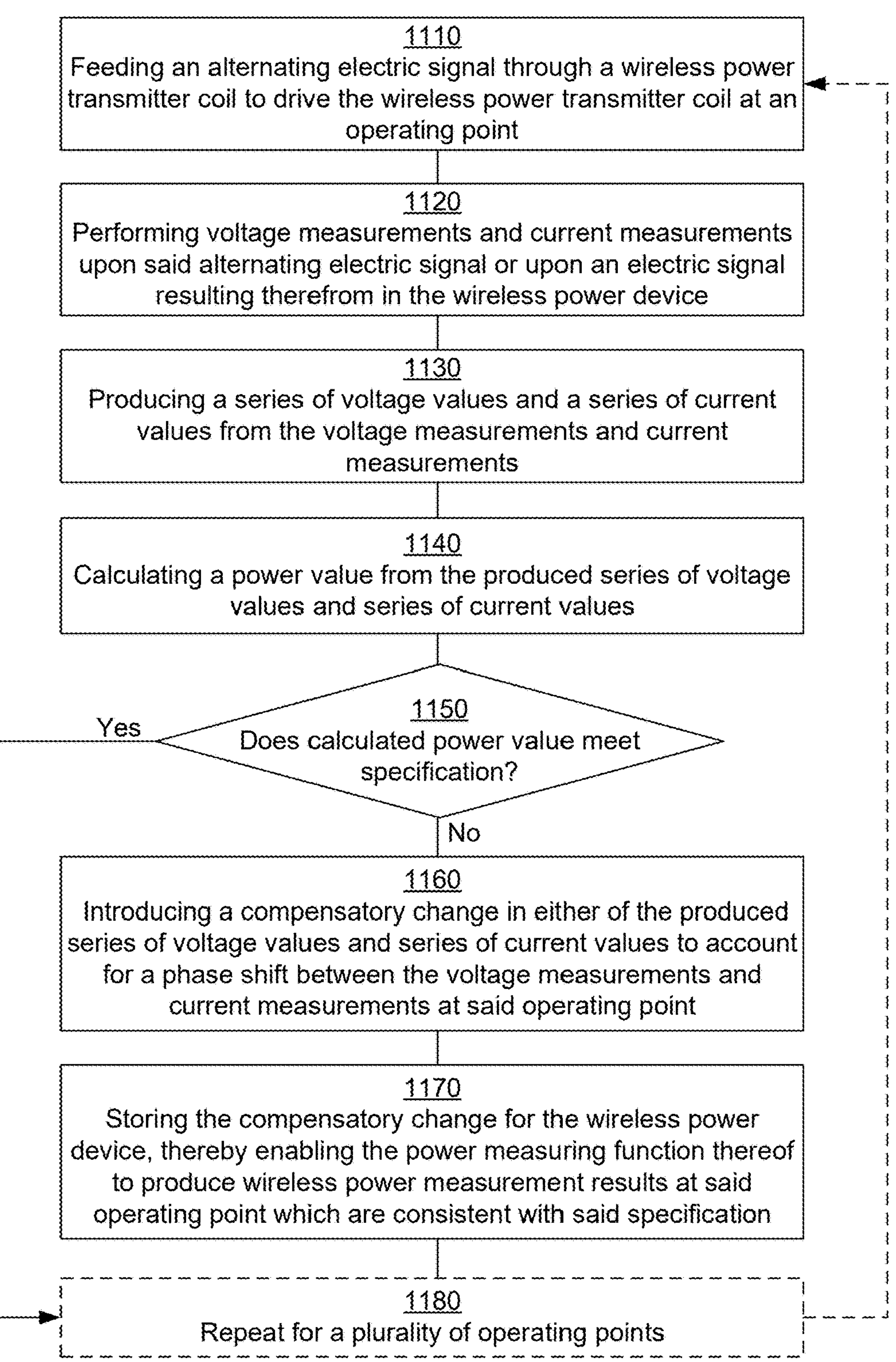
FIG. 11 is a flowchart diagram of a method of calibrating a power measuring function of a wireless power device generally according to the present invention.

Reference is made to FIG. 11. As can be seen in FIG. 11, a method 1100 of calibrating a power measuring function of a wireless power device is provided. Different non-limiting examples of wireless power devices 510; 710; 940 and the power measuring functions 516; 716; 946 thereof which can be calibrated according to the method 1100 which be presented later with reference to FIGS. 5, 7 and 9, with respective embodiments of the method 1100 being shown in FIGS. 6, 8 and 10.

The method 1100 involves feeding 1110 an alternating electric signal through a wireless power transmitter coil to drive the wireless power transmitter coil at an operating point. Examples of such wireless power transmitter coils are seen at 520, 720 and 920 in FIGS. 5, 7 and 9.

The method 1100 further involves performing 1120 voltage measurements and current measurements upon said alternating electric signal or upon a current signal resulting therefrom in the wireless power device.

The method 1100 then produces 1130 a series of voltage values and a series of current values from the voltage measurements and current measurements, and calculates 1140 a power value from the produced series of voltage values and series of current values.

The method 1100 then assesses 1150 whether the calculated power value meets a specification. This may involve comparing the calculated power value to an expected power value, wherein the calculated power value is considered to meet the specification if it deviates from the expected power value no more than by a margin of error or falls within an accepted range of accuracy. The expected power value can follow from a requirement stipulated by a standard for wireless power transfer, such as Qi. In some embodiments (such as the one described below for FIGS. 7 and 8), the expected power value follows from a received power value determined by a calibrated wireless power receiver device being in co-operation with the wireless power device.

If the calculated power value fails to meet the specification as assessed in step 1150, a compensatory change (cf. the value ε described above) is introduced 1160 in either of the produced series of voltage values and series of current values to account for a phase shift between the voltage measurements and current measurements at said operating point. The compensatory change is stored 1170 for the wireless power device. This will enable the power measuring function (e.g. 516; 716; 946) of the wireless power device (e.g. 510; 710; 940) to produce wireless power measurement results at said operating point which are consistent with said specification by using the stored compensatory change to compensate for the phase shift.

Optionally but advantageously, the steps of the method 1100 are repeated for a plurality of operating points. This can be seen at 1180 in FIG. 11.

An operating point may typically be defined by one of the following parameters, or by a combination of two or more of them:

- a fundamental frequency of the alternating electric signal;
- harmonic contents of the alternating electric signal;
- a load resistance;
- a nominal RMS current value of the alternating electric signal;
- a nominal RMS voltage value of the alternating electric signal; and
- an operating temperature.

To ensure reliable calibration, the method 1100 typically comprises introductory steps of independently assessing (see 612-614 in FIG. 6; 812-814 in FIG. 8; 1012-1014 in FIG. 10) the ability of the power measuring function (e.g. 516; 716; 946) of the wireless power device (e.g. 510; 710; 940) to determine RMS voltage values and RMS current values at a specified accuracy, and if necessary calibrating (see 618 in FIG. 6; 818 in FIG. 8; 1018 in FIG. 10) the power measuring function of the wireless power device.

Advantageously, in step 1130 of the method 1100, the series of voltage values is a time series produced by sampling, at a sampling rate, of the voltage measurements as obtained by the voltage measurement circuitry 340 (FIG. 3) of the wireless power device. Correspondingly, the series of current values is a time series produced by sampling, at said sampling rate, of the current measurements as obtained by the current measurement circuitry 320 of the wireless power device.

The compensatory change may then conveniently take the form of an artificial delay added to these time series. Accordingly, the compensatory change is introduced in step 1160 of the method 1100 (and correspondingly at step 630 in FIG. 6, step 830 in FIG. 8 and step 1030 in FIG. 10) by applying an artificial delay ε to one of said time series of current values or voltage values, such that for an original time series i(n)=i(t) or v(n)=v(t) for every $t=k\cdot T_{sample}$, where $T_{sample}$ is the inverse of the sampling rate, the artificial delay ε is applied to yield a compensated time series i(n)=i(t+ε) or v(n)=v(t+ε).

In more detail, the artificial delay ε is advantageously applied to said one time series of current values or voltage values such that the RMS value thereof remains unchanged and the electric power value calculated from the compensated time series and the other time series of current values or voltage values meets or becomes closer to said specification.

Exemplary Embodiments

Figure 5:
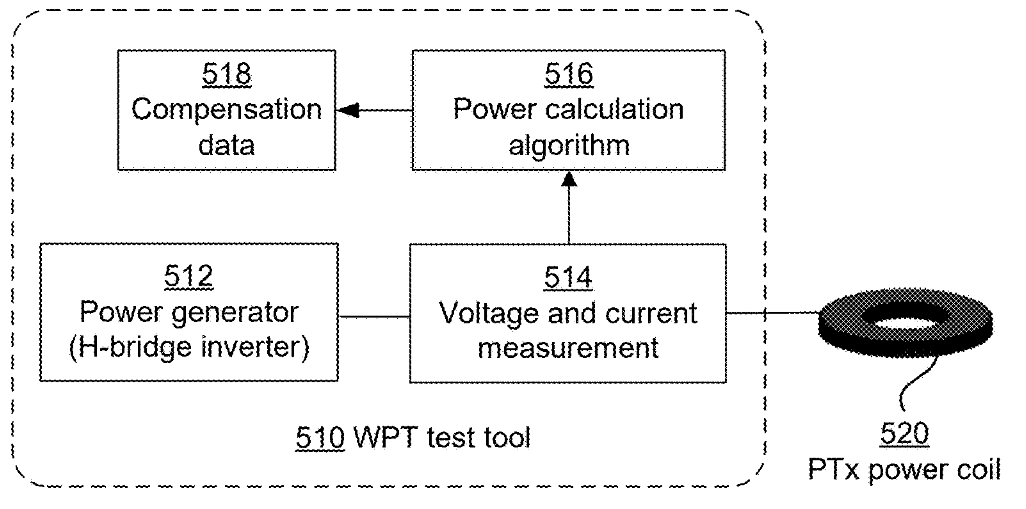
FIG. 5 is a block diagram illustrating a first example of a wireless power device having a power measuring function.
Figure 6:
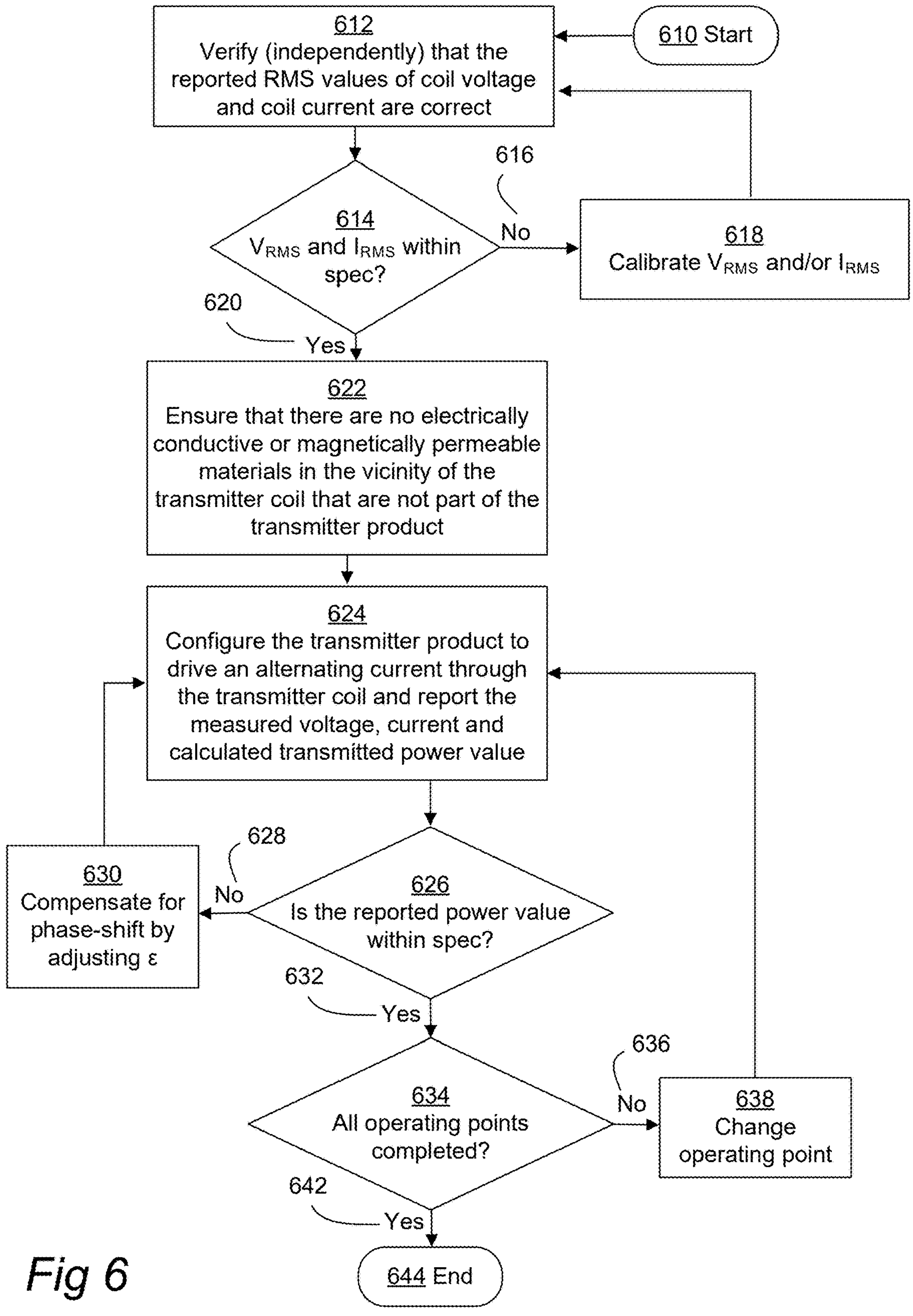
FIG. 6 is a flowchart diagram of a first embodiment of a power calibration method performable for the wireless power device in FIG. 5.

FIGS. 5 and 6 present a first example of a wireless power device 510 having a power measuring function 516 which can be calibrated with a first embodiment 600 of the inventive method 1100 described above.

The wireless power device 510 in FIG. 5 is a test tool for wireless power transfer (abbreviated WPT). More specifically, it is of a kind designed for testing of end-user wireless power receiver devices, like the mobile device 110 (e.g. 110*a*-110*d*) in FIG. 1 as previously described. The wireless power device 510 comprises a wireless power transmitter having a wireless power transmitter coil 520 and being driven by a power generator 512 that comprises an H-bridge inverter. The wireless power transmitter coil 520 is comprised in, galvanically coupled to or otherwise associated with (e.g. via inductive forwarding) the wireless power device 510.

During normal testing, the wireless power device 510 will be operated at different operating points in the presence of a wireless power receiver device for the purpose of testing the latter's compliance with an applicable standard for wireless power transfer, such as Qi. To this end, the wireless power device 510 further comprises one or more sensors, such as a temperature sensor, for measuring parameters of the test environment.

The operating points may, for instance, relate to the frequency, shape, direction and/or magnitude of the field generated by the wireless power transmitter coil 520, the surface temperature as measured by one or more of said sensors, or any combination or derivative thereof.

The wireless power device 510 moreover comprises measurement functionality operatively coupled to the wireless power transmitter coil 520 and being configured to measure or determine various measurement data, including the voltage and current of electric signals flowing in the wireless power transmitter coil 520. As the skilled person will understand, these electric signals will be affected not only by drive signals fed from the power generator 512, but also by the electromagnetic (or inductive) interaction with the wireless power receiver device as being present during normal testing. The measurement functionality thus comprises circuitry 514 for voltage and current measurements which, for instance, may be implemented like the measurement arrangement 300 described above with reference to FIG. 3.

As part of the testing functionality of the wireless power device 510, it has power calculation functionality 516 for calculating power from voltage and current measurements provided by the circuitry 514.

The wireless power device 510 may, for instance, be implemented by or based upon a CATS II Mobile Device Tester which is commercially available from nok9 AB, Stora Trädgårdsgatan 30, SE 211 28 Malmö, Sweden. The wireless power device 510 may, for instance, be compliant with the Test Power Transmitter described in chapter 4 of "The Qi Wireless Power Transfer System", Power Class 0 Specification, Part 3: Compliance Testing, version 1.2.4, February 2018, or any compatible subsequent version of this specification.

Unlike normal testing, the wireless power device 510 will be operated in the absence of a wireless power receiver device when performing the calibration method 600 in FIG. 6. This method will now be described.

The purpose of the method 600 is to produce compensation data (e.g. the value ε) for the compensatory change referred to in steps 1160 and 1170 as described above for the method 1100 in FIG. 11. The method 600 in FIG. 6 begins with introductory steps 610-618 for ensuring reliable calibration. As previously mentioned, in these steps an independent assessment is made regarding the ability of the power measuring function (power calculation functionality 516) of the wireless power device 510 to determine RMS voltage values and RMS current values at a specified accuracy, and if necessary calibrating the power measuring function of the wireless power device. Since the wireless power device 510 is operated in isolation (no wireless power receiver device being present) when the calibration method 600 in FIG. 6 is performed, the RMS voltage values and RMS current values should ideally be zero (0), and any deviation from zero (0) in excess of the specified accuracy will call for calibration in step 618 using some external equipment having a verified calibration ability.

After these introductory steps, a check is made in step 622 to ensure that there are no electrically conductive or magnetically permeable materials in the vicinity of the wireless power transmitter coil 520 that are not part of the transmitter product (wireless power device 510). This step may involve a manual (ocular) inspection by a human test operator, or an automated check using for instance digital image capturing and analysis.

In steps 624-630 of the method 600, the main functionality of the inventive calibration method 1100, i.e. steps 1110-1160 thereof as described above, will then follow by operating the wireless power device 510 at one operating point. Any compensatory change (value ε) determined will be stored at step 632, as described for step 1170 of the inventive calibration method 1100. The storing of the determined compensatory change may involve any storage means available internally in the wireless power device 510 or otherwise associated therewith. Non-limiting examples are a computer-readable internal memory such as ROM, RAM, SRAM, DRAM, FLASH, DDR or SDRAM, or a secondary storage such as a solid state drive or a hard drive, or a remote (e.g. cloud-based) storage accessible by local or wide-area communication means, such as wireless communication like Bluetooth, WiFi, WCDMA, GSM, UTRAN, HSPA, LTE, LTE Advanced or 5G, or wired communication like simple electric wiring, serial communication like USB or Ethernet.

This will enable the power measuring function (power calculation functionality 516) of the wireless power device 510 to produce wireless power measurement results at said operating point which are consistent with the relevant specification during subsequent operation of the wireless power device 510 for normal testing (i.e., in the presence of a wireless power receiver device), by applying the stored compensatory change when the power calculation functionality 516 calculates any power measurement results.

The procedure of steps 624-630 is then repeated for other operating points, as seen at 634-638, and the respective compensatory change is stored at 632 for the respective operating point of the wireless power device 510.

The method 600 ends at 644 when all operating points have been run through.

In summary, for the first example and embodiment in FIGS. 5 and 6, all steps of the method 600 are performed by the wireless power device 510; the wireless power transmitter coil 520 is comprised in, galvanically coupled to or otherwise associated with the wireless power device; the voltage measurements and current measurements are performed upon the alternating electric signal as fed through the wireless power transmitter coil 520 in the absence of a wireless power receiver coil; and assessing whether the calculated power value meets the specification involves assessing whether it falls within a specified error margin from zero power.

Figure 7:
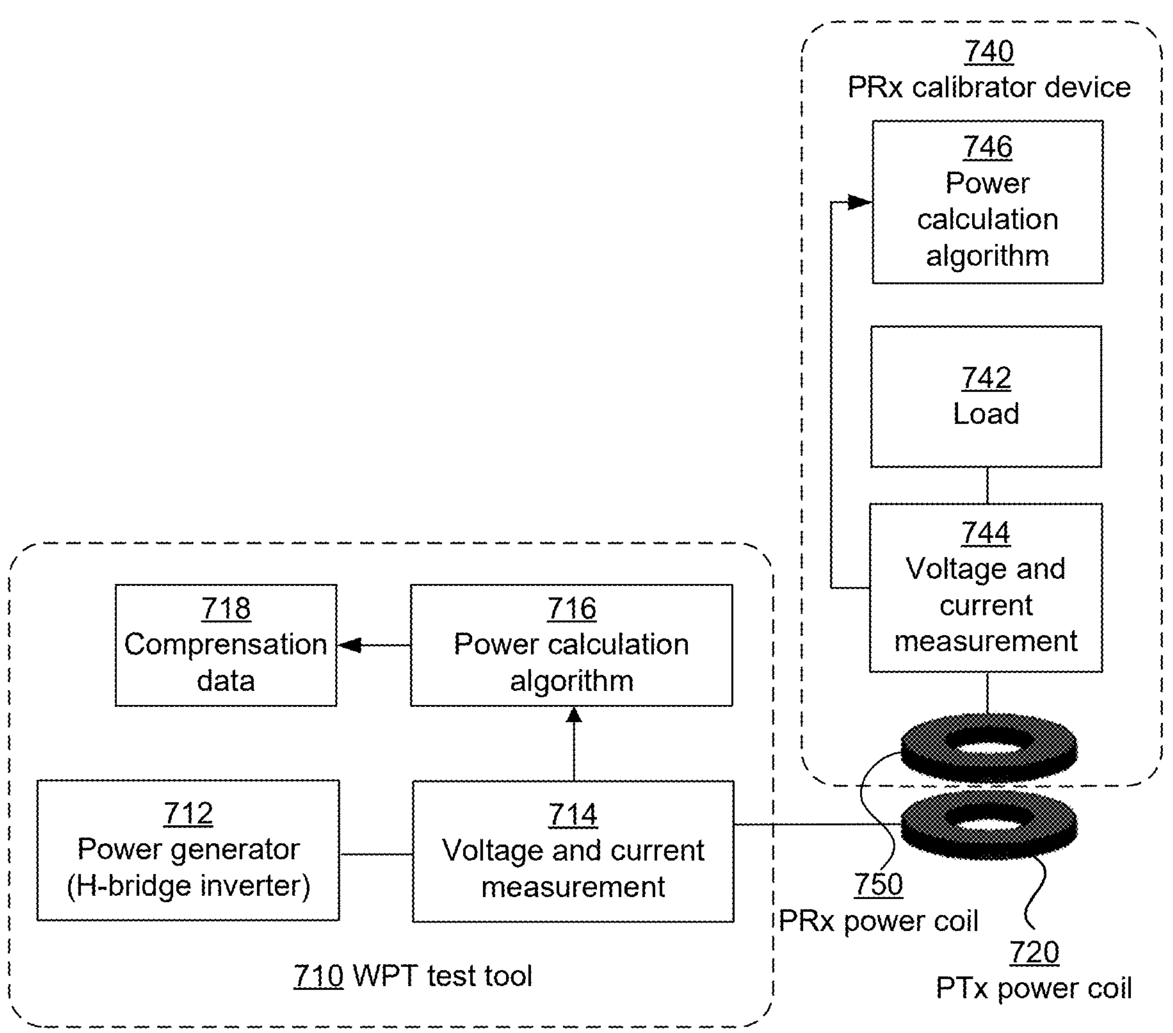
FIG. 7 is a block diagram illustrating a second example of a wireless power device having a power measuring function, operating with a calibrated wireless power receiver device.
Figure 8:
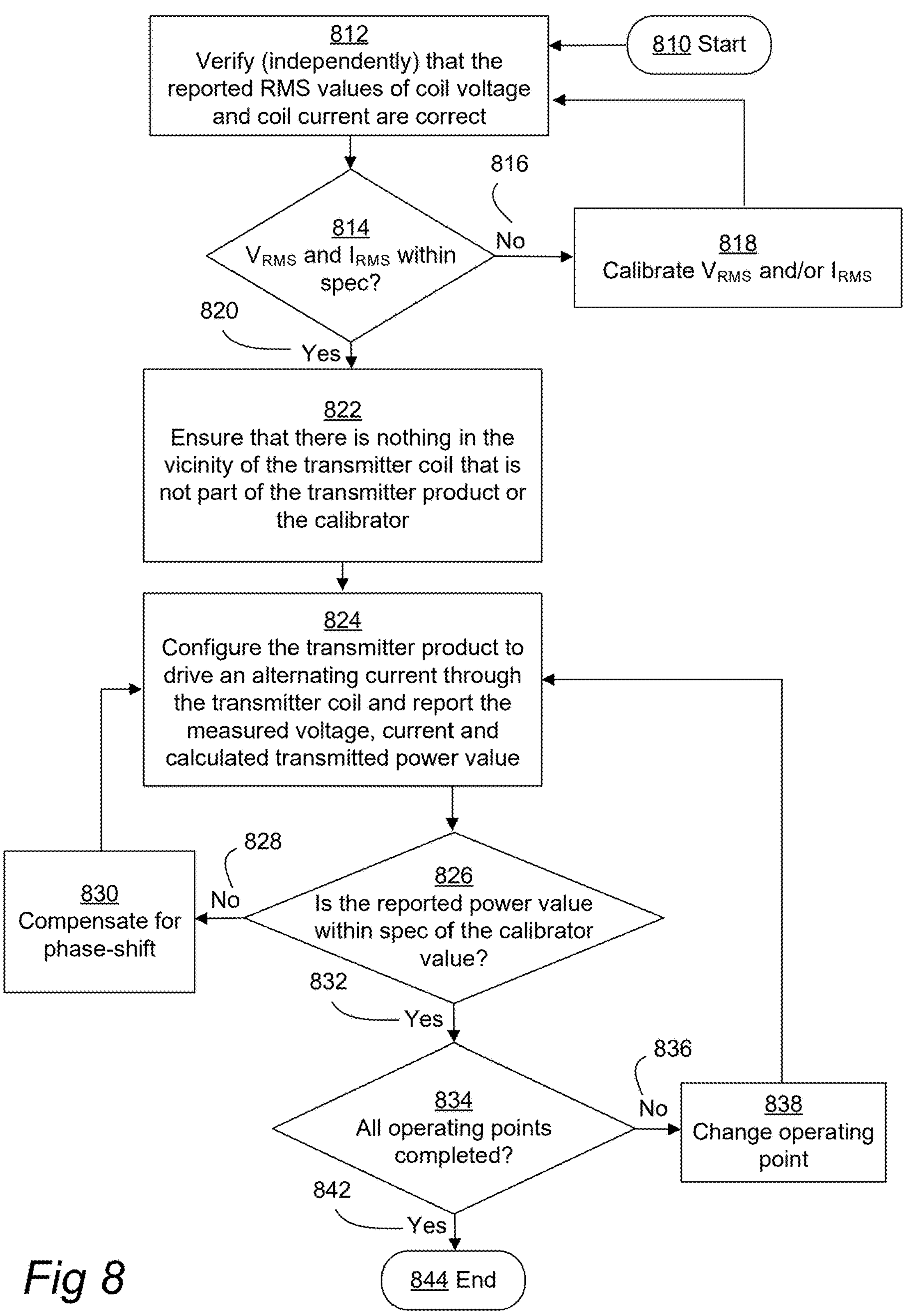
FIG. 8 is a flowchart diagram of a second embodiment of a power calibration method performable for the wireless power device in FIG. 7.

FIGS. 7 and 8 present a second example of a wireless power device 710 having a power measuring function 716 which can be calibrated with a second embodiment 800 of the inventive method 1100 described above. The main difference from the first example 510/first embodiment 600 in FIGS. 5 and 6 is that the wireless power device 710 is now operated together with a calibrated wireless power receiver device 740.

A wireless power receiver coil 750 is comprised in, galvanically coupled to or otherwise associated with the calibrated wireless power receiver device 740. The calibrated wireless power receiver device 740 comprises a load 742 and circuitry 744 for voltage and current measurements coupled to the wireless power receiver coil 720. The circuitry 744 may, for instance, be implemented like the measurement arrangement 300 described above with reference to FIG. 3. The calibrated wireless power receiver device 740 furthermore has power calculation functionality 746 for calculating power from voltage and current measurements provided by the circuitry 744.

The wireless power device 710 in FIG. 7 is a test tool for wireless power transfer. It is or can be identical to the wireless power device 510 in FIG. 5, except for being designed to perform the calibration method 800 in FIG. 8 in the presence of the calibrated wireless power receiver device 740. The calibration method 800 in FIG. 8 is or can be identical to the calibration method 600 in FIG. 6, except for steps 826 and 830 where the compensatory change (value ε) is determined by comparing the calculated power value to an expected power value given by a received power value as determined by the power calculation functionality 746 of the wireless power receiver device 740. Hence, unlike step 626 in FIG. 6, the expected power value will not be a zero (0) value.

In summary, for the second example and embodiment in FIGS. 7 and 8, the wireless power device is a wireless power transmitter device 710; the wireless power transmitter coil 720 is comprised in, galvanically coupled to or otherwise associated with the wireless power transmitter device 710; all steps of the method 800 are performed by the wireless power transmitter device 710 (except the provision of the received power value from the calibrated wireless power receiver device 740); the voltage measurements and current measurements are performed upon the alternating electric signal as fed through the wireless power transmitter coil 710 in the presence of the wireless power receiver coil 750 of the calibrated wireless power receiver device 740; and assessing whether the calculated power value meets the specification involves assessing whether it matches, within a specified error margin, a received power value determined by the calibrated wireless power receiver device 740.

Figure 9:
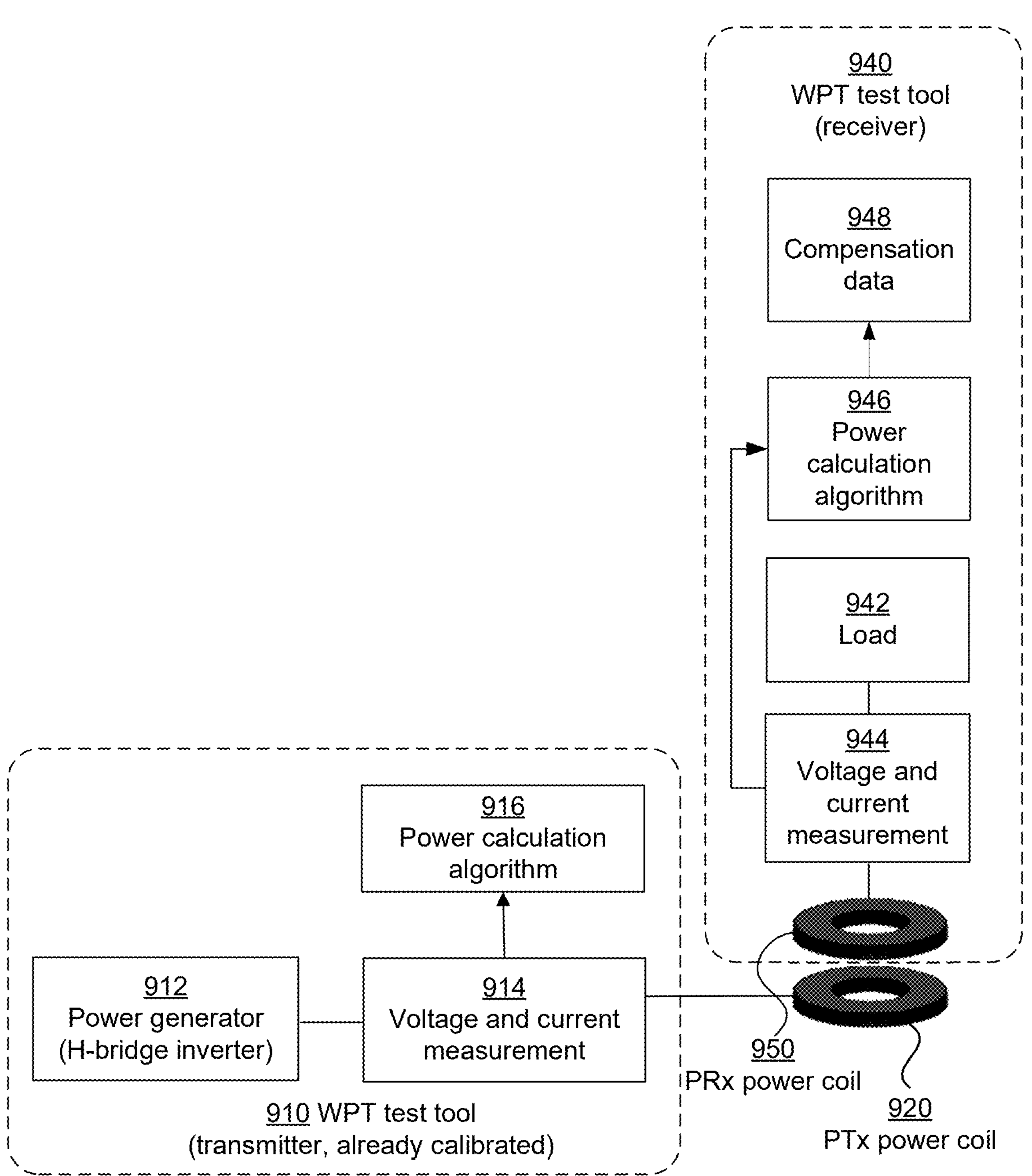
FIG. 9 is a block diagram illustrating a third example of a wireless power device having a power measuring function, being a wireless power receiver device and operating with a calibrated wireless power transmitter device.

FIGS. 9 and 10 present a third example of a wireless power device 940 having a power measuring function 946 which can be calibrated with a third embodiment 1000 of the inventive method 1100 described above.

For this third example/embodiment, the roles of the wireless power transmitter device 910 and the wireless power receiver device 940 have been switched compared to the second example/embodiment. Whereas in FIGS. 7 and 8, a compensatory change could be determined for the wireless power transmitter device 710 since the wireless power receiver device 740 was already calibrated, FIGS. 9 and 10 make use of the fact that the wireless power transmitter device 910 has already been calibrated, either in accordance with the second example/embodiment of FIGS. 7 and 8, or in accordance with the first example/embodiment of FIGS. 5 and 6. The calibrated wireless power transmitter device 910 is thus used for the purpose of allowing determining of a compensatory change for the wireless power receiver device 940, which for instance may be a WPT test tool designed for testing of base stations (e.g. wireless Qi chargers).

In summary, for the third example and embodiment in FIGS. 9 and 10, the wireless power device is a wireless power receiver device 940 with a wireless power receiver coil 950 comprised in, galvanically coupled to or otherwise associated therewith; the wireless power transmitter coil 920 is comprised in, galvanically coupled to or otherwise associated with a wireless power transmitter device 910; the feeding step 1110 of the method 1100 in FIG. 11 is performed by the wireless power transmitter device 910; all other steps of the method 1100 in FIG. 11 are performed by the wireless power receiver device 940; the voltage measurements and current measurements are performed upon a resulting alternating electric signal received through the wireless power receiver coil 950 of the wireless power receiver device 940 in response to said alternating electric signal being fed through the wireless power transmitter coil 920; and assessing whether the calculated power value meets the specification involves assessing whether it falls within a specified error margin from a transmitted power value determined by the wireless power transmitter device 910.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A method of calibrating a power measuring function of a wireless power device, the method comprising:

feeding an alternating electric signal through a wireless power transmitter coil to drive the wireless power transmitter coil at an operating point;

performing voltage measurements and current measurements upon said alternating electric signal or upon a current signal resulting therefrom in the wireless power device;

producing a series of voltage values and a series of current values from the voltage measurements and current measurements;

calculating a power value from the produced series of voltage values and series of current values;

assessing whether the calculated power value meets a specification;

if not, introducing a compensatory change in either of the produced series of voltage values and series of current values to account for a phase shift between the voltage measurements and current measurements at said operating point; and storing the compensatory change for the wireless power device, thereby enabling the power measuring function thereof to produce wireless power measurement results at said operating point which are consistent with said specification, wherein:

the wireless power device is a wireless power transmitter device, the wireless power transmitter coil is comprised in, galvanically coupled to or otherwise associated with the wireless power transmitter device, all steps of the method are performed by the wireless power transmitter device, the voltage measurements and current measurements are performed upon the alternating electric signal as fed through the wireless power transmitter coil in the presence of a wireless power receiver coil of a calibrated wireless power receiver device, and assessing whether the calculated power value meets the specification involves assessing whether it matches, within a specified error margin, a received power value determined by the calibrated wireless power receiver device.

2. The method as defined in claim 1, wherein the steps of the method are repeated for a plurality of operating points.

3. The method as defined in claim 2, wherein an operating point is defined by one of, or a combination of two or more of, the following:

a fundamental frequency of the alternating electric signal;

harmonic contents of the alternating electric signal;

a load resistance;

a nominal RMS current value of the alternating electric signal;

a nominal RMS voltage value of the alternating electric signal; and an operating temperature.

4. The method as defined in claim 1, further comprising introductory steps of:

independently assessing the ability of the power measuring function of the wireless power device to determine RMS voltage values and RMS current values at a specified accuracy; and if necessary, calibrating the power measuring function of the wireless power device.

5. The method as defined in claim 1, wherein the series of voltage values is a time series produced by sampling, at a sampling rate, of the voltage measurements as obtained by voltage measurement circuitry of the wireless power device, and wherein the series of current values is a time series produced by sampling, at said sampling rate, of the current measurements as obtained by current measurement circuitry of the wireless power device.

6. The method as defined in claim 5, wherein the compensatory change is introduced by applying an artificial delay ε to one of said time series of current values or voltage values, such that for an original time series $i(n)=i(t)$ or $v(n)=v(t)$ for every $t=k \cdot T_{sample}$, where $T_{sample}$ is the inverse of the sampling rate, the artificial delay ε is applied to yield a compensated time series $i(n)=i(t+\varepsilon)$ or $v(n)=v(t+\varepsilon)$.

7. The method as defined in claim 6, wherein the artificial delay ε is applied to said one time series of current values or voltage values such that the RMS value thereof remains unchanged and the electric power value calculated from the compensated time series and the other time series of current values or voltage values meets or becomes closer to said specification.

8. A method of calibrating a power measuring function of a wireless power device, the method comprising:

feeding an alternating electric signal through a wireless power transmitter coil to drive the wireless power transmitter coil at an operating point;

performing voltage measurements and current measurements upon said alternating electric signal or upon a current signal resulting therefrom in the wireless power device;

producing a series of voltage values and a series of current values from the voltage measurements and current measurements;

calculating a power value from the produced series of voltage values and series of current values;

assessing whether the calculated power value meets a specification;

if not, introducing a compensatory change in either of the produced series of voltage values and series of current values to account for a phase shift between the voltage measurements and current measurements at said operating point; and storing the compensatory change for the wireless power device, thereby enabling the power measuring function thereof to produce wireless power measurement results at said operating point which are consistent with said specification, wherein:

the wireless power device is a wireless power receiver device with a wireless power receiver coil comprised in, galvanically coupled to or otherwise associated therewith, the wireless power transmitter coil is comprised in, galvanically coupled to or otherwise associated with a wireless power transmitter device, the feeding step is performed by the wireless power transmitter device, all other steps of the method are performed by the wireless power receiver device, the voltage measurements and current measurements are performed upon a resulting alternating electric signal received through the wireless power receiver coil of the wireless power receiver device in response to said alternating electric signal being fed through the wireless power transmitter coil, and assessing whether the calculated power value meets the specification involves assessing whether it falls within a specified error margin from a transmitted power value determined by the wireless power transmitter device.

9. The method as defined in claim 8, wherein the steps of the method are repeated for a plurality of operating points.

10. The method as defined in claim 9, wherein an operating point is defined by one of, or a combination of two or more of, the following:

a fundamental frequency of the alternating electric signal;

harmonic contents of the alternating electric signal;

a load resistance;

a nominal RMS current value of the alternating electric signal;

a nominal RMS voltage value of the alternating electric signal; and an operating temperature.

11. The method as defined in claim 8, further comprising introductory steps of:

independently assessing the ability of the power measuring function of the wireless power device to determine RMS voltage values and RMS current values at a specified accuracy; and if necessary, calibrating the power measuring function of the wireless power device.

12. The method as defined in claim 8, wherein the series of voltage values is a time series produced by sampling, at a sampling rate, of the voltage measurements as obtained by voltage measurement circuitry of the wireless power device, and wherein the series of current values is a time series produced by sampling, at said sampling rate, of the current measurements as obtained by current measurement circuitry of the wireless power device.

13. The method as defined in claim 12, wherein the compensatory change is introduced by applying an artificial delay ε to one of said time series of current values or voltage values, such that for an original time series i(n)=i(t) or v(n)=v(t) for every $t=k \cdot T_{sample}$, where $T_{sample}$ is the inverse of the sampling rate, the artificial delay ε is applied to yield a compensated time series i(n)=i(t+ε) or v(n)=v(t+ε).

14. The method as defined in claim 13, wherein the artificial delay ε is applied to said one time series of current values or voltage values such that the RMS value thereof remains unchanged and the electric power value calculated from the compensated time series and the other time series of current values or voltage values meets or becomes closer to said specification.

15. A method of calibrating a power measuring function of a wireless power device, the method comprising:

feeding an alternating electric signal through a wireless power transmitter coil to drive the wireless power transmitter coil at an operating point;

performing voltage measurements and current measurements upon said alternating electric signal or upon a current signal resulting therefrom in the wireless power device;

producing a series of voltage values and a series of current values from the voltage measurements and current measurements;

calculating a power value from the produced series of voltage values and series of current values;

assessing whether the calculated power value meets a specification;

if not, introducing a compensatory change in either of the produced series of voltage values and series of current values to account for a phase shift between the voltage measurements and current measurements at said operating point; and storing the compensatory change for the wireless power device, thereby enabling the power measuring function thereof to produce wireless power measurement results at said operating point which are consistent with said specification, wherein the method further comprises introductory steps of:

independently assessing the ability of the power measuring function of the wireless power device to determine RMS voltage values and RMS current values at a specified accuracy; and if necessary, calibrating the power measuring function of the wireless power device.

* * * * *